United States Patent
Beck et al.

(10) Patent No.: US 7,612,340 B2
(45) Date of Patent: Nov. 3, 2009

(54) METHOD OF OPERATING AN AVALANCHE PHOTODIODE FOR REDUCING GAIN NORMALIZED DARK CURRENT

(75) Inventors: Jeffrey Don Beck, Plano, TX (US);
Pradip Mitra, Colleyville, TX (US);
Chang-Feng Wan, Dallas, TX (US);
Michael A. Kinch, Dallas, TX (US)

(73) Assignee: DRS Sensors & Targeting Systems, Inc., Palm Bay, FL (US)

( * ) Notice: Subject to any disclaimer, the term of this patent is extended or adjusted under 35 U.S.C. 154(b) by 112 days.

(21) Appl. No.: 11/196,100

(22) Filed: Aug. 3, 2005

(65) Prior Publication Data
US 2007/0029485 A1    Feb. 8, 2007

(51) Int. Cl.
*H01L 31/107* (2006.01)
*G01J 5/20* (2006.01)

(52) U.S. Cl. .................................................. 250/338.4

(58) Field of Classification Search ............... 250/338.4, 250/252.1, 340, 370.11, 370.13, 395
See application file for complete search history.

(56) References Cited

U.S. PATENT DOCUMENTS

| | | | |
|---|---|---|---|
| 4,390,889 A | 6/1983 | Capasso et al. | 357/30 |
| 5,818,322 A | 10/1998 | Tasumi | 338/15 |
| 6,072,201 A * | 6/2000 | Fang et al. | 257/186 |
| 2001/0023944 A1 | 9/2001 | Maruyama et al. | 257/53 |
| 2002/0195545 A1* | 12/2002 | Nishimura et al. | 250/214.1 |
| 2003/0030951 A1 | 2/2003 | Green | 361/56 |
| 2003/0047752 A1 | 3/2003 | Campbell et al. | 257/186 |
| 2004/0038472 A1 | 2/2004 | Ando et al. | 438/200 |
| 2004/0089876 A1 | 5/2004 | Kuwatsuka | 257/186 |
| 2004/0245592 A1* | 12/2004 | Harmon et al. | 257/438 |
| 2005/0134715 A1* | 6/2005 | Fowler et al. | 348/308 |
| 2008/0017785 A1* | 1/2008 | Byren | 250/214 R |
| 2008/0308716 A1* | 12/2008 | Byren | 250/214 R |

FOREIGN PATENT DOCUMENTS

WO    WO 2004/027879 A1 *    4/2004

OTHER PUBLICATIONS

Velicu S., Ashokan R., Sivananthan S.; A Model For Dark Current And Multiplication In HgCdTe Avalanche Photodiodes; 2000; Journal of Electronic Materials; vol. 29; No. 6; pp. 823-827.*
Velicu S., Ashokan R., Sivananthan S.; A Model for Dark Current and Muliplication in HgCdTe Avalanche Photodiodes; 2000; Journal of Electronic Materials; vol. 29 No. 6; pp. 823-827.*
G. Leveque, M. Nasser, D. Bertho, B. Orsal and R. Alebedra, Semicond. Sci. Technol., 8, 1317-1325 (1993).
M. Jack, et al., Proc. SPIE, vol. 4454, pp. 198-206 (2001).

(Continued)

*Primary Examiner*—David P Porta
*Assistant Examiner*—David S Barker
(74) *Attorney, Agent, or Firm*—Sonnenschein Nath & Rosenthal LLP

(57) ABSTRACT

An avalanche photodiode is operated in avalanche mode at a selected reverse bias that achieves high gain and a reduced gain normalized dark current.

16 Claims, 6 Drawing Sheets

OTHER PUBLICATIONS

J.D. Beck, C-F Wan, M.A. Kinch and J.E. Robinson, Proc. SPIE, vol. 4454, pp. 188-197 (2001).

F. Ma, X. Li, J. Campbell, J. Beck, C. Wan, M. Kinch, Appl. Phys. Lett. 83(4), 785 (2003).

M. Kinch, J. Beck, C. Wan, F. Ma and J. Campbell, J. Electron. Mater. 33(6), 630 (2004).

R.J. McIntyre, IEEE Trans. Electron Devices 13, 164 (1966).

R.J. McIntyre, IEEE Trans. Electron. Devices 46, 1623 (1999).

J. Beck, C. Wan, M. Kinch, J. Robinson, P. Mitra, R. Scritchfield, F. Ma and J. Campbell, Proceedings of SPIE, vol. 5564, pp. 4453 (2004).

* cited by examiner

PRIOR ART

METHOD OF OPERATING AN AVALANCHE PHOTODIODE FOR REDUCING GAIN NORMALIZED DARK CURRENT

FIELD OF THE INVENTION

The present invention relates to avalanche photodiode detectors and, more particularly, operating an avalanche photodiode at an avalanche gain that reduces the gain normalized dark current of the avalanche photodiode and achieves improved signal-to-noise level performance.

BACKGROUND OF THE INVENTION

State-of-the-art active infrared ("IR") systems require photodiode detectors that can be operated at high gain and low noise in the near infrared ("NIR"), short-wave infrared ("SWIR"), mid-wave infrared ("MWIR") and long-wave infrared ("LWIR") bands. Photodiodes are normally operated at low reverse bias voltages that are well below avalanche breakdown. When higher reverse bias voltages are applied to a photodiode, the photodiode operates as an avalanche photodiode ("APD") and an internal current gain is achieved, thereby increasing the signal response or responsivity of the photodiode detector. The internal current gain that occurs under avalanche operation conditions in an APD results from the well known phenomenon of impact ionization. In impact ionization, photogenerated minority carriers from a photon absorption region of the APD, which are representative of absorbed optical energy signals, are injected into and then multiply within a carrier multiplication region of the APD.

APDs, which can be fabricated from semiconductor materials such as Si, InGaAs/InP, InP, InAlAs, etc., are designed to maximize the injection of the signal current, or photogenerated minority carriers, from the absorption region into the carrier multiplication region of the photodiode. In addition, APDs are designed to minimize noise. The noise can include excess noise, which can be a function of the gain of the APD, and noise based on dark current. Sources of dark current, as well known in the art, can include thermally generated dark currents and tunnel dark currents. By maximizing signal current and minimizing noise, high signal-to-noise level performance can be achieved in the APD, which improves the ultimate sensitivity of a detector formed from the APD.

Research on APDs has focused on obtaining higher gains while minimizing noise so that a greater responsivity can be achieved. For example, specialized architectures, such as the cylindrical architecture shown in Beck, J. D. et al., Proc. SPIE, Vol. 4454, pp. 188-197 (2001) ("Beck 2001"), incorporated by reference herein, which are distinct from those used in photodiodes normally operated in a non-APD mode and favor signal carrier injection into the carrier multiplication region over tunnel dark currents, have been developed. In addition, some APDs, such as narrow bandgap APDs fabricated from InGaAs/InP, include separate photon absorption and carrier multiplication regions that function to minimize tunneling of dark current from the narrower bandgap InGaAs absorption region into the carrier multiplication region.

In early generation APDs, excess noise of the APD, or noise in excess of the noise multiplied by the gain, substantially impacted the signal-to-noise level of the APD. As is well known in the art, gain processes are random in an APD and the shot noise, $I_S$, for an APD is defined as follows:

$$I_S = \sqrt{2qIM^2F} \quad (1)$$

where M is the gain, F is the excess noise factor, q is the charge and I is the gain multiplied current for M=1. The excess noise factor is a function of the ratio, k, of ionization coefficients of holes $\alpha_h$ and electrons $\alpha_e$, or $k=\alpha_h/\alpha_e$. The excess noise factor quantitatively defines the excess noise for the APD, such that the APD will have excess noise if F is greater than 1 when M is greater than 1. Assuming that another high reverse bias breakdown mechanism, such as dark current tunneling, is absent in an APD, the excess noise factor determines at what gain value the APD noise reaches the system noise and, hence, the minimum noise equivalent power ("NEP").

The original model for excess noise in early generation APDs ("McIntyre model") assumed a constant field, a constant k in the carrier multiplication region and a history independent carrier ionization process. See McIntyre, R. J., 13 IEEE Trans. Electron Device at 164 (1966), incorporated by reference herein. Minimum noise is realized when the minority carriers generated in the absorption region of the APD are the dominant multiplying species. According to the McIntyre model, the excess noise factor, $F_n$, for an nth electron injection APD, which is one of a plurality of such APDs constituting pixels in a detector array, is a function of k and defined as follows:

$$F_n = M_n \left[ 1 - (1-k) \left[ \frac{(M_n - 1)}{M_n} \right]^2 \right] \quad (2)$$

FIG. 1 illustrates the behavior of the excess noise factor versus gain as a function of k in an electron injection APD according to the McIntyre model. Referring to FIG. 1, in an electron injection APD ("EAPD"), electron minority carrier generation and multiplication is preferred, in other words, a low k is preferred to achieve the lowest noise. In contrast, in a hole injection APD where the hole minority carrier is the dominant multiplying species, a large k achieves the lowest noise.

In early generations of APDs fabricated in silicon, germanium and like semiconductor materials, it was found that the excess noise increased with the gain in agreement with the McIntyre model, and that the shot noise (see Equation (1)) increased faster than the gain. Once some minimum level of gain was present in such early generation APDs, the excess noise started to degrade the signal-to-noise performance. The gain at which signal-to-noise performance began to degrade in such APDs depended on the pre-amplifier noise or the noise level of the detector system.

In addition, early generations of APDs fabricated in HgCdTe and like semiconductor materials had the characteristic of premature dark current breakdown, in other words, generation of high levels of dark current at high reverse bias (high gain). This characteristic prevented practical operation of such APDs at high gain. The dark currents at increasing reverse bias (higher gains) were so high in such APDs that they masked the excess noise behavior of the APDs. These high dark currents were attributable to defects that were formed in the semiconductor materials of such early generation APDs and were the result of the semiconductor manufacturing techniques and materials existing in the prior art at that time. Early generation HgCdTe and like material APDs, thus, typically were operated only at relatively low gains and, for some time, there was little or no desire in the prior art to further research and develop such APDs for high gain operation.

Over the years, semiconductor fabrication processes and semiconductor materials technology improved. Later generations of APDs contained less defects in the semiconductor material and improved architectures for limiting noise due to premature dark current breakdown effects. It was eventually found that operation of later generation electron injection photodiodes fabricated in HgCdTe in an avalanche mode provided for relatively high gain and low, gain independent excess noise. See Beck 2001. For example, it was found that a later generation EAPD fabricated in HgCdTe has a k approximately equal to zero. The improvement in excess noise performance in such later generation EAPDs was significant in comparison with the excess noise performance of early generation EAPDs made from InGaAs and Si, which had k values equal to 0.45 and 0.02, respectively and, therefore, had the characteristic of increasing excess shot noise with increasing gain.

As known in the art, when the level of reverse bias applied to an APD is increased to obtain higher gains, tunnel breakdown may start to occur, such that the dark current generated in the APD substantially increases. Although dark current in early generation wide bandgap APDs was relatively low so that dark current was not a primary concern in such APDs even at higher gains, it was well known in the prior art that there was a substantial presence of dark current at increasing gain in early generation narrow bandgap APDs, such as HgCdTe APDs. Early generation HgCdTe APDs, thus, had a high gain normalized dark current at high gains. As known in the art, increases in the gain normalized dark current of an APD adversely affect signal-to-noise level performance.

The discovery that later generation HgCdTe APDs had a low, gain independent excess noise characteristic was significant in the detector field, but this discovery did not provide any information regarding the contribution of dark current to the noise in such later generation APDs, especially at high gain applications. Consequently, there was a continuing expectation in the prior art that high levels of dark current would exist at high gains in later generation narrow bandgap APDs, including those narrow bandgap APDs exhibiting gain independent excess noise such as the HgCdTe APDs described in Beck 2001. This expectation in the prior art of high dark current at high gain served as a disincentive for operating later generation narrow bandgaps APDs, such as the later generation HgCdTe APDs described in Beck 2001, at higher gains, despite the finding that such APDs had a gain independent excess noise factor.

Therefore, there exists a need for a method of operating an avalanche photodiode at an avalanche gain that reduces the gain normalized dark current for the photodiode.

SUMMARY OF THE INVENTION

In accordance with the method of the present invention, an avalanche photodiode ("APD"), which has sources of dark current that are dominant when a reverse bias below an avalanche gain threshold voltage is applied, and where the gain normalized dark current of the APD attributable to the dominant sources of dark current is not multiplied by the gain of the APD, is operated at a selected reverse bias to cause the APD to operate in an avalanche mode and have a gain that reduces the gain normalized dark current of the APD. The dark current from the dominant sources is substantially comprised of at least one of generation-recombination current and diffusion current generated in a carrier multiplication region of the APD that is coupled to a photon absorption region of the APD. By applying increasing levels of reverse bias to the APD that do not exceed the avalanche gain threshold voltage of the APD, the gain of the APD increases while the gain normalized dark current in the APD decreases. In a preferred embodiment, a selected reverse bias is applied to the APD to achieve a minimized gain normalized dark current and, thus, an optimized signal-to-noise level for the APD.

In another preferred embodiment, the APD on which the inventive method is performed has an excess noise factor that is substantially gain independent. In a further preferred embodiment, the APD on which the inventive method is performed is an APD fabricated in HgCdTe or like semiconductor materials.

In a further preferred embodiment, optimized signal-to-noise level operation of the APD on which the inventive method is performed is achieved (i) by experimentally determining a selected reverse bias below the avalanche gain threshold voltage that provides a high gain and also reduces the gain normalized dark current to a minimum, and (ii) then by applying the selected bias to the APD. In a preferred embodiment, the gain versus gain normalized dark current behavior of the APD is experimentally determined by applying increasing levels of reverse bias to the APD. Based on the observed gain versus gain normalized dark current behavior of the APD, a reverse bias corresponding to a minimum gain normalized dark current is identified and then applied to the APD to achieve optimized responsivity.

In a preferred embodiment where the APD on which the inventive method is performed has a gain dependent excess noise factor, the reverse bias for achieving optimized signal-to-noise level performance for the APD is selected in view of the dependence of the excess noise on the gain, in other words, the value of k for the APD.

BRIEF DESCRIPTION OF THE DRAWINGS

Other objects and advantages of the present invention will be apparent from the following detailed description of the presently preferred embodiments, which description should be considered in conjunction with the accompanying drawings in which like references indicate similar elements and in which.

DETAILED DESCRIPTION OF THE INVENTION

For purposes of highlighting the inventive method of operating an avalanche photodiode, where the avalanche photodiode has sources of dark current that are dominant when a reverse bias below an avalanche gain threshold voltage is applied, and where the gain normalized dark current of the avalanche photodiode attributable to the dominant sources of the dark current is not multiplied by the gain of the avalanche photodiode, at a selected reverse bias that reduces the gain normalized dark current of the avalanche photodiode, the inventive method is described below in connection with an exemplary prior art HgCdTe avalanche photodiode having the above-recited gain normalized dark current behavior and also having a gain independent excess noise factor. It is to be understood that the method of the present invention is applicable in avalanche photodiodes fabricated from other semiconductor materials, such as InSb, InAs and the like, where such photodiodes have the above-recited gain normalized dark current behavior.

Figure 1:
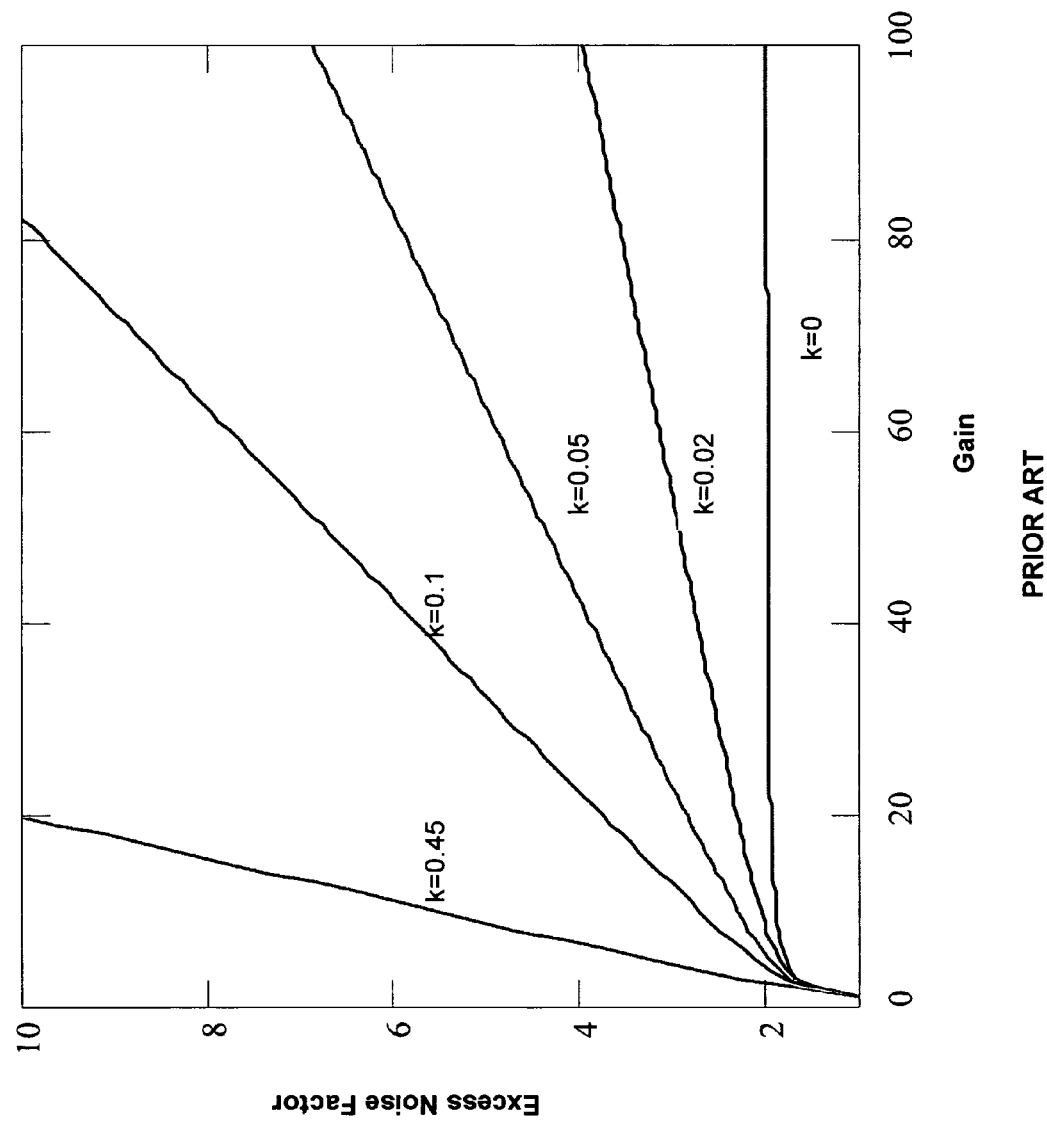
FIG. 1 is graphical illustration of theoretical excess noise factor versus gain for exemplary prior art avalanche photodiodes having different k values.
Figure 2B:
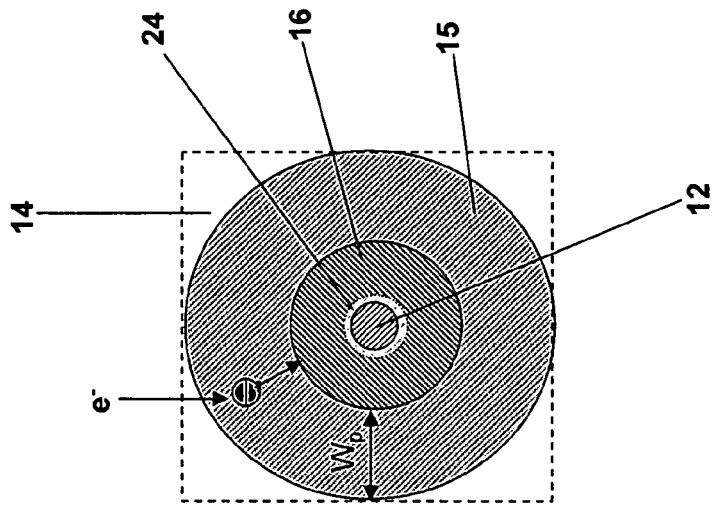
FIG. 2B is a top down view of selected components of the photodiode of FIG. 2A.
Figure 2A:
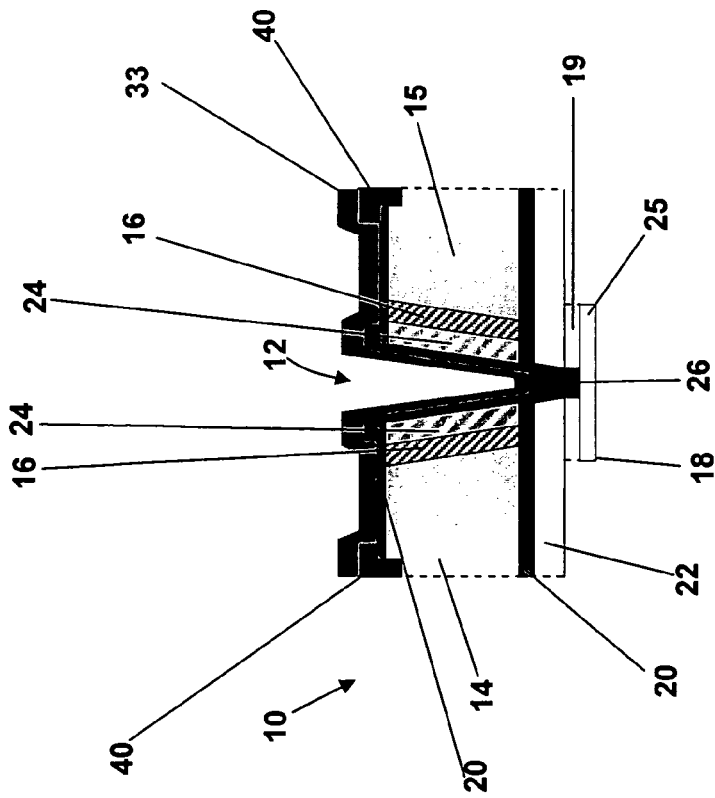
FIG. 2A is a cross-sectional view of an exemplary prior art HgCdTe avalanche photodiode.

FIG. 2A is a cross-sectional view of a preferred embodiment of an exemplary prior art, gain independent excess noise factor HgCdTe electron injection avalanche photodiode ("APD") 10 having sources of dark current that are dominant when a reverse bias below the avalanche gain voltage threshold for the APD is applied, and where the gain normalized dark current of the APD attributable to the dominant sources of dark current is not multiplied by the gain of the APD 10. As the gain normalized dark current of the APD 10 attributable to the dominant sources of dark current is not gain multiplied, the gain normalized dark current attributable to the dominant sources of dark current decreases as the gain of the APD 10 is increased, as long as the reverse bias applied to the APD 10 is below the avalanche gain voltage threshold for the APD 10. In accordance with the method of the present invention, applying a reverse bias below the avalanche gain voltage threshold to the APD 10 provides for operation of the APD 10 at an avalanche gain and at a reduced gain normalized dark current.

Structural and operational features of the APD 10 are initially described below with reference to FIGS. 2A, 2B and 3 to provide for ease of illustration and explanation of the method of the present invention. Referring to FIG. 2A, the APD 10 is a front-side illuminated device and has a high density, vertically integrated photodiode ("HDVIP") cylindrical architecture, such as typically employed in MWIR and LWIR staring focal plane arrays known in the art. The APD 10 is formed around a small hole or via 12 etched into a semiconductor membrane layer 14, which is preferably fabricated from HgCdTe. The via 12 provides for an electrical interconnection between the APD 10 and an input 18 to a conventional readout circuit, as described in detail below.

Referring to FIG. 2A, and also to FIG. 2B which is a top down view of selected components of the APD 10 of FIG. 2A, the HgCdTe layer 14 is typically about 3-9 μm thick, doped by Group II site vacancy acceptors and Group IB acceptor impurities, and counter-doped, at a lower level, with indium donors to form a p-type HgCdTe epi-region 15. The p-type region 15 functions as a photon absorption region. Each of the front and back surfaces of the layer 14 includes a passivated HgCdTe film 20, which is formed by interdiffusion of CdTe as is well known in the art. The APD 10 is mounted to the readout input 18 by a thin, uniform, epoxy layer 22 disposed between the back HgCdTe passivation layer 20 and a SiO$_2$ layer 19 on the readout input 18.

As known in the art, during fabrication of the APD 10, the via 12 is etched using an ion mill etch, which creates an n+/n– region around the via 12. The etching process creates a Hg interstitial flux that fills vacancies and pushes out mobile Group IB acceptor impurities in the region around the via 12, which results in an n– region 16 that is doped in the low $10^{14}$ cm$^{-3}$ range by the residual indium donors. The etch damage at the surface of the layer 14 facing the via 12 results in the thin n+ surface layer or region 24.

Referring again to FIG. 2A, the via 12 extends vertically through the HgCdTe layer 14, the epoxy 22 and the SiO$_2$ layer 19, and terminates at the readout input 18. Metal deposited in the via 12 constitutes an electrical interconnection 26 between the APD 10 and the readout input 18. For de-biasing control, small front-side, non-injecting, contacts 40 are formed in the perimeter region of the APD 10. An anti-reflective coating 33 covers the top of the APD 10 to maximize quantum efficiency.

As well known in the art, a photodiode such as the APD 10 typically is in the form of a pixel in a focal plane array containing a matrix of such photodiodes, and the array includes a substrate contact ring (not shown) that encircles the pixels and establishes the electrical connections to the p-side of the photodiodes. The HDVIP architecture of the APD 10 provides a quality of passivation and immunity to defects in the semiconductor material of an APD that contributed to the discovery that a HgCdTe electron injection APD ("EAPD") having the construction of the APD 10 and fabricated using later generation semiconductor processing techniques has a low, gain independent excess noise factor. See Beck 2001.

Figure 3:
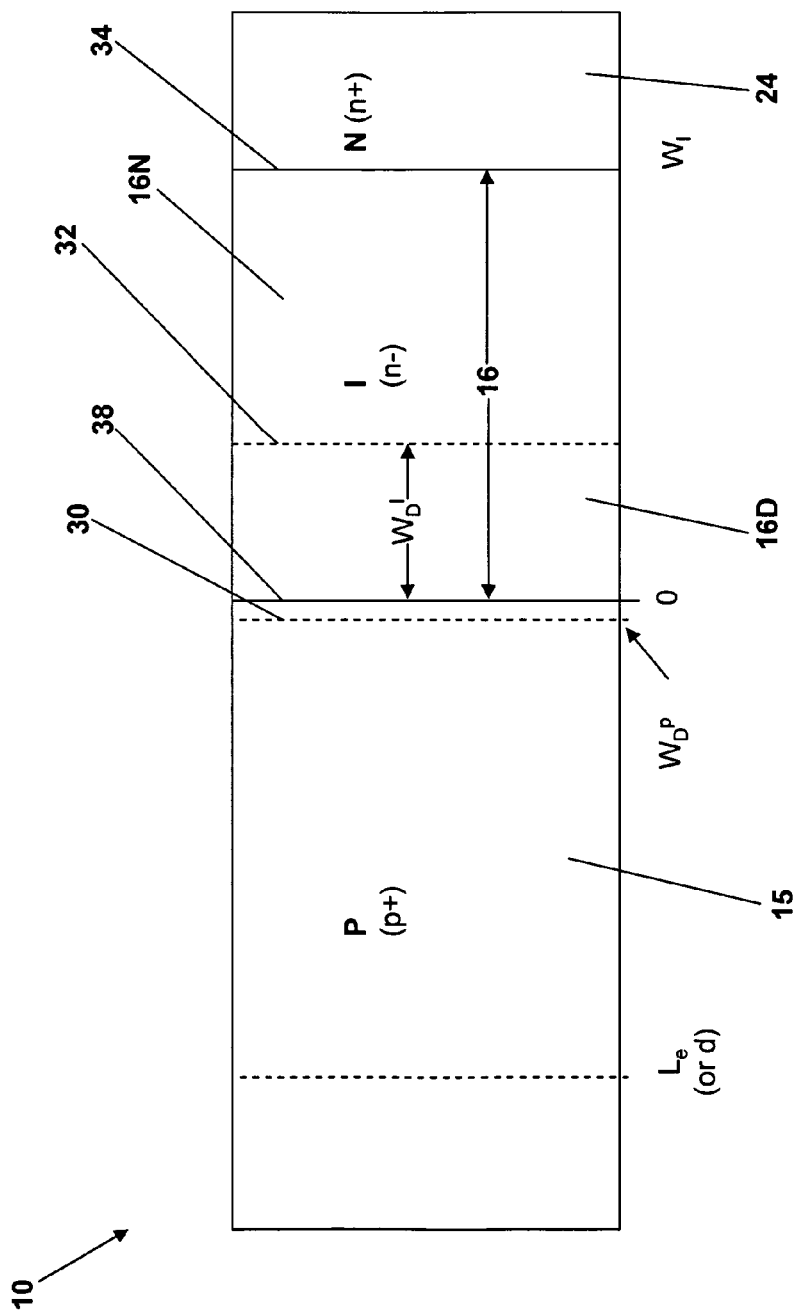
FIG. 3 is a schematic, sectional view of the photodiode of FIG. 2A.

FIG. 3 schematically illustrates the regions of the APD 10 that form the n+/n–/p cylindrical junction shown in FIGS. 2A and 2B. Referring to FIG. 3, the APD 10 includes the P (p+) region 15 or photon absorption region, the intrinsic I (n–) region 16 and the N (n+) region 24. The I and N regions, in combination, constitute the carrier multiplication region of the APD. In the illustrated embodiment, each of the P region 15 and the N region 24 is a heavily doped region, and the intrinsic region 16 is a lightly doped region. In addition, the P and I regions 15 and 16, respectively, have depletion region boundaries 30 and 32.

Still referring to FIG. 3, as increasing reverse bias is applied to the APD 10, the depletion region 16D within the intrinsic region 16 begins to extend further away from an interface or boundary 38, which is between the p+ region 15 and the n– region 16, and toward an interface or boundary 34, which is between the n– region 16 and the n+ region 24. As the reverse bias continues to increase, the depletion width, $W_D^I$, of the depletion region 16D, which extends between the boundary 38 and a boundary 32, continues to increase, such that the boundary 32 continues to extend toward, and then ultimately reaches, the region 24. In other words, the reverse bias voltage applied to the APD 10 eventually reaches the punch-through bias necessary to drive the depletion region 16D in the I region 16 all the way to the boundary 34 between the n+ region 24 and the n– region 16. As is well known in the prior art, application of such a high reverse bias across the region 16 generates a sufficiently high electric field across the region 16D to support avalanche multiplication within the region 16D. Thus, with increased reverse bias, $W_D^I$ approaches the width, $W_I$, of the region 16, such that the region 16 is completely depleted and becomes the multiplication region for the APD 10.

Referring to FIG. 2B and FIG. 3, the p-region 15 around the depletion region 16D constitutes the absorption region. Photons absorbed in the p-region 15 create minority carrier electrons (e– on FIG. 2B) that diffuse into the carrier multiplication region 16D. Referring to FIGS. 2A, 2B and 3, the diameter of the via 12 and the diffusion length of the carriers determines the radial distance, $W_p$, between the largest circle that fits in a unit pixel of a focal plane array formed from the APD 10 and the edge of the multiplication region 16. $W_p$, which is the width of the collection region 15, defines the bandwidth of the APD 10. The bandwidth of the APD 10 is determined by the time t it takes for minority carrier electrons in the absorption region 15 to diffuse to the multiplication region 16, assuming that the bandwidth of the multiplication region 16D is not limiting. In an APD where the diffusion length of the electron is much greater than $W_p$, the width $W_p$ and the mobility of the electron determine the time t. If the diffusion length is short, then the response time is approximately the lifetime of the minority carrier.

Figure 4:
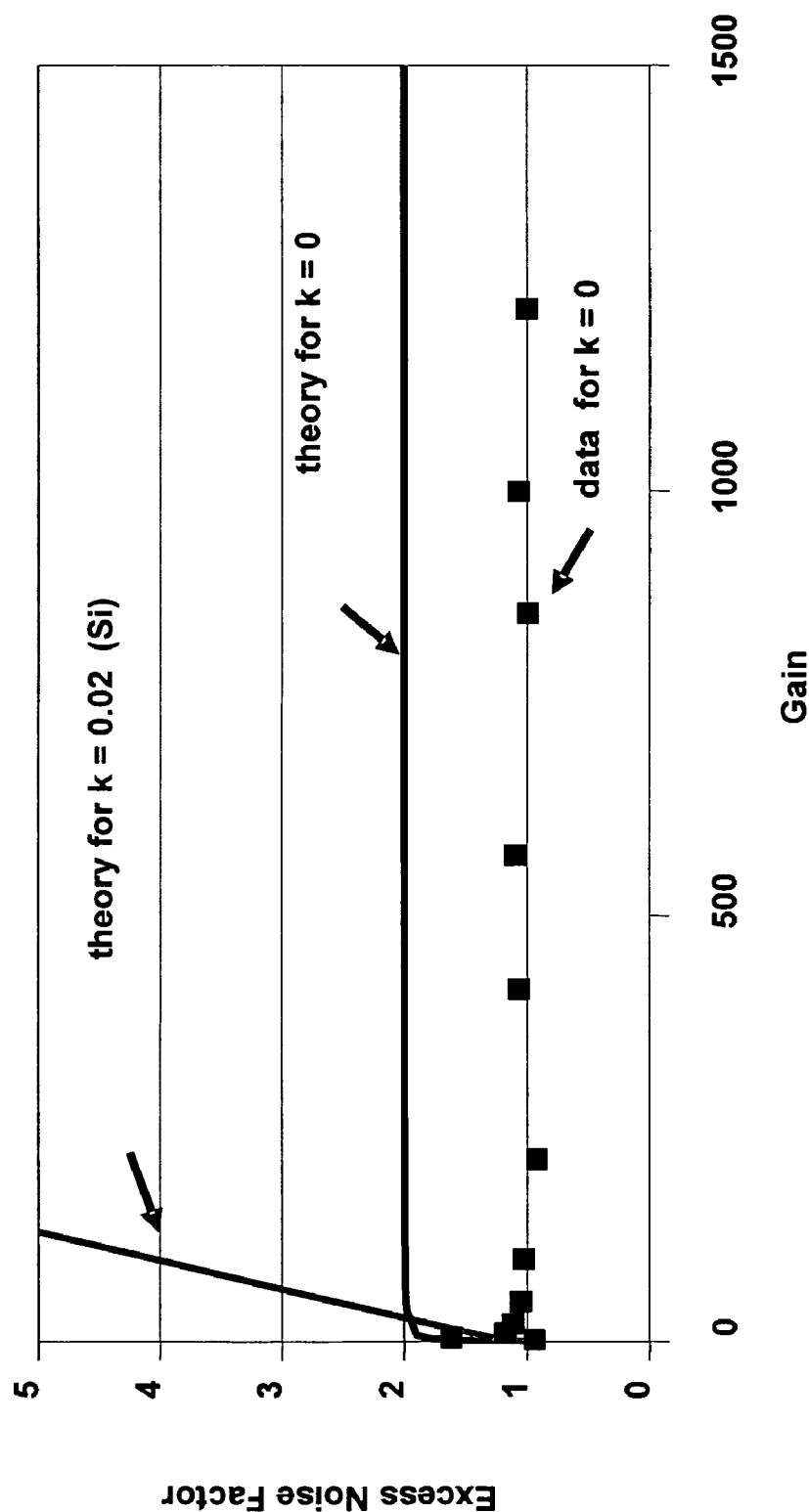
FIG. 4 is a graphical illustration of excess noise factor versus gain data for exemplary HgCdTe avalanche photodiodes, where each of the photodiodes has a gain independent excess noise factor, and of theoretical excess noise factor versus gain for avalanche photodiodes having k=0 and k=0.02.

As described in Beck 2001, it was found that, when later generations of gain independent excess noise factor (k=0) HgCdTe APDs are operated at high reverse biases to achieve high gains, the excess noise factor associated with these high gains is lower than the theoretical excess noise factor that would be expected in accordance with the McIntyre model. Referring to Equation (1), the observation of such APD operation was contrary to the prior art McIntyre model requirement that excess noise increases faster than the signal as gain is increased in an APD because excess noise factor increases with gain in APDs. In addition, in follow-up experimentation on later generation gain independent excess noise factor HgCdTe APDs that were the same as or similar to the later generation gain independent excess noise factor HgCdTe APDs described in Beck 2001, it was observed that these later generation HgCdTe APDs had improved signal-to-noise level performance in comparison to what was previously expected for an APD based on prior art high gain noise modeling for APDs. FIG. 4 graphically illustrates the excess noise factor versus gain data obtained from experimentation on such later generation gain independent excess noise factor HgCdTe EAPDs in comparison with theoretical excess noise factor versus gain values for k=0 and k=0.02 EAPDs.

Based on still further study and experimentation on these later generation gain independent excess noise factor HgCdTe APDs, it was unexpectedly and surprisingly found that such APDs can be operated in the avalanche gain mode at an avalanche gain that reduces the gain normalized dark current for the APD. The experimentation was performed on an FPA including sMWIR 64 µm pitch pixels in an 8×8 array format, where the pixels constituted gain independent excess noise factor HgCdTe EAPDs of the type described in Beck 2001. It was observed from the experimentation that gains greater than 1000 were achieved with a low dark current and low excess noise and without any sign of avalanche breakdown and, furthermore, that the gains were achieved with excellent gain uniformity and operability at a single bias voltage.

Figure 5:
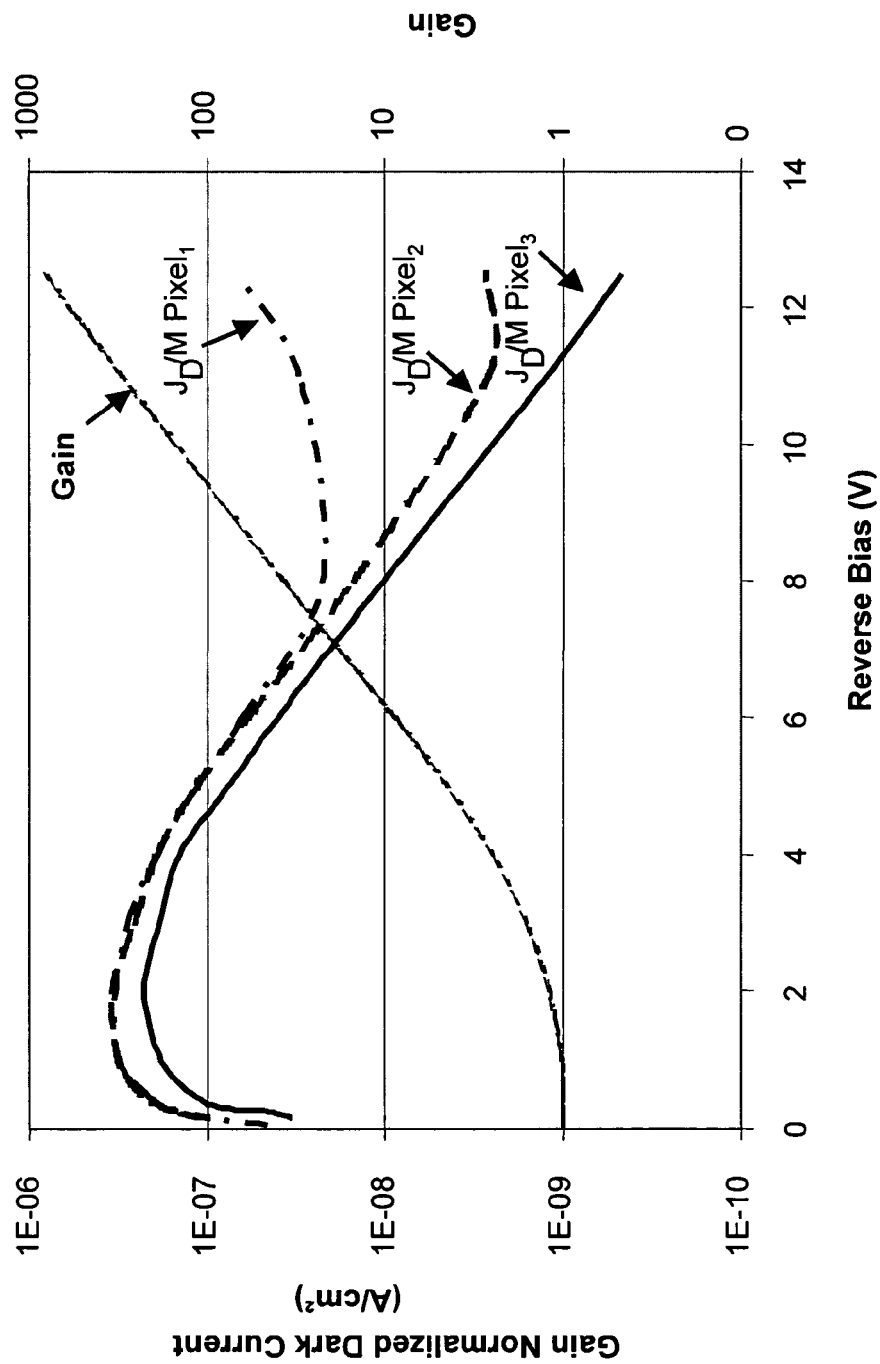
FIG. 5 is a graphical illustration of gain normalized dark current versus reverse bias data and gain versus reverse bias data for exemplary HgCdTe avalanche photodiodes, where each of the avalanche photodiodes has a gain independent excess noise factor and sources of dark current that are dominant when a reverse bias below an avalanche gain threshold voltage is applied, and where the gain normalized dark current of the avalanche photodiodes attributable to the dominant sources of the dark current is not multiplied by the gain of the avalanche photodiode.
Figure 6:
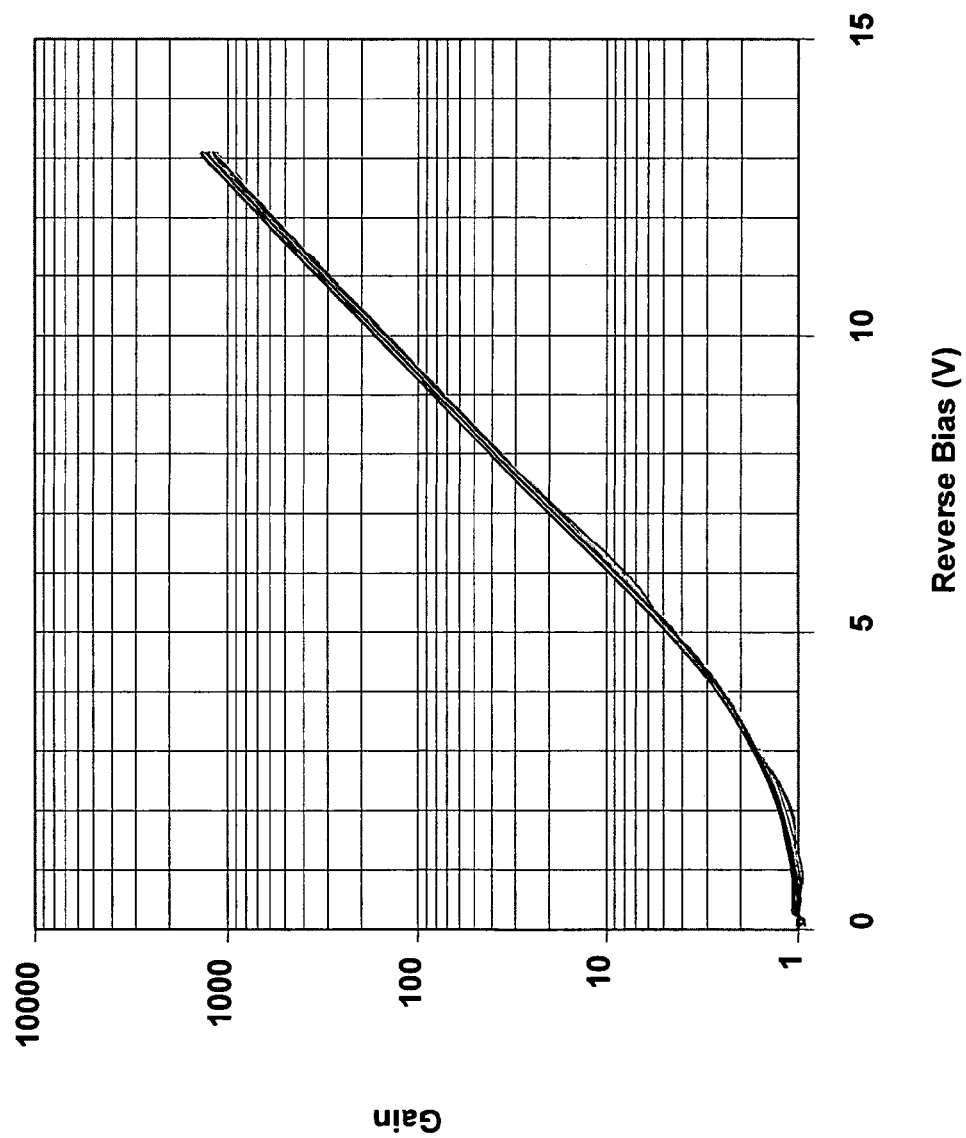
FIG. 6 is a graphical illustration of gain versus reverse bias data for exemplary prior art HgCdTe avalanche photodiodes having a gain independent excess noise factor.

FIG. 5 illustrates gain normalized dark current and gain data obtained by varying the reverse bias applied to three exemplary gain independent excess noise factor HgCdTe APDs that were selected as representative pixels from the experimental 8×8 array of sMWIR HgCdTe EAPDs, where the APDs had a cutoff wavelength of about 4.3 micrometers and an operating temperature of about 77° K. FIG. 6 illustrates gain versus reverse bias data for 53 of 54 of the APDs of the 8×8 experimental array. Referring to FIG. 5, it was observed that application of about a 12.5 V reverse bias to the three APDs (pixels) provided for a gain of about 852 and a median gain normalized dark current ($J_D$/M) of about 0.14 pA or 3.4 nA/cm². Referring to FIG. 6, the gain versus bias voltage data for the experimental 8×8 array of sMWIR HgCdTe EAPDs showed that the APDs had a mean gain of 1270 at 13.1 V reverse bias with a a/mean uniformity of 4.5%.

Based on the unexpected and surprising experimental finding that later generation gain independent excess noise factor HgCdTe APDs, similar to those described in Beck 2001, could be operated at a high reverse bias that reduces the gain normalized dark current, such APDs were further analyzed to understand this operation. The analysis determined that, in such APDs, (i) generation-recombination current and diffusion current from the carrier multiplication region of the APD are dominant sources of dark current when a reverse bias below the avalanche gain threshold voltage is applied to the APD; and (ii) the gain normalized dark current of the APD attributable to the dominant sources of dark current is not multiplied by the gain of the APD, in other words, the gain normalized dark current is reduced with increasing gain. At reverse biases greater than the avalanche gain threshold voltage, other sources of dark current in the APD, such as fully gained optical or thermal dark currents from the absorption region or tunnel breakdown dark currents, begin to dominate the composition of the dark current. In a most preferred embodiment of the present invention, a selected reverse bias is applied to the APD to minimize the gain normalized dark current and, thus, optimize the signal-to-noise level performance of the APD.

The behavior of dark current sources in the APD 10 is described in detail below to explain how the inventive method of operating the APD 10 in avalanche mode at selected reverse biases can achieve high gain at a reduced gain normalized dark current. Referring to FIG. 3, the dark current, $J_D^I$, generated in the I region 16 of the APD 10 is the sum of the surface and bulk generation-recombination ("GR") currents in the depletion region 16D, which has a width $W_D^I$, and the diffusion currents from the neutral region 16N, which extends between the boundary 32 and the boundary 34, or:

$$J_D^I = G_{GR}^I W_D^I + G_{GR}^{I-S} W_D^I + G_{DIFF}^I (W_I - W_D^I) \qquad (3)$$

where $W_D^I$ is the width of the depletion region 16D in the intrinsic region 16, $W_I$ is the width of the intrinsic region 16, $G_{GR}^I$ is the volume GR current generation rate in the GR region 16D per unit length, $G_{GR}^{I-S}$ is the surface GR current generation rate per unit length, and $G_{DIFF}^I$ is the volume diffusion current generation rate in the neutral I region 16N. For convenience, it is assumed that a hole in the I region 16 has a diffusion length greater than $W_I$.

Thus, the total dark current, $J_D^{tot}$, in the APD 10 equals the sum of the dark current from the P and I regions, assuming negligible contribution from the n+ region, where:

$$J_D^{tot} = J_D^I + J_D^P$$

and where $$J_D^P = G_{DIF}^P * L_e + G_{GR}^P W_D^P + G_{GR}^{P-S} W_D^P$$

such that $$J_D^{tot} = G_{GR}^I W_D^I + G_{GR}^{I-S} W_D^I + G_{DIFF}^I (W_I - W_D^I) + G_{DIF}^P * L_e + G_{GR}^P W_D^P + G_{GR}^{P-S} W_D^P \qquad (4)$$

In Equation (4), the last three terms constitute the contributions of diffusion and GR current from the P region, and $L_e$ is the diffusion length of the electron on the p-side of the junction. If the lateral width of the P region defined by d is $<L_e$, then d would replace $L_e$ in Equation (4).

Referring again to FIG. 3, as the reverse bias applied to the APD 10 is increased, the depletion region width $W_D^I$ increases until it becomes equal to the width of the n− region $W_I$. From Equations (3) and (4), it is seen that the diffusion current from the I region will be reduced as ($W_I - W_D$) goes to zero and that the GR current will increase until it reaches its maximum value when $W_D=W_I$. At this point the dark current is given by:

$$J_D^{tot}=(G_{GR}^I+G_{GR}^{I-S})W^I+G_{DIF}^P*L_e+G_{GR}^P W_D^P+G_{GR}^{P-S}W_D^P \quad (5)$$

Then, assuming that minority carriers are optically generated only in the P region (the absorption region), which assumption simplifies the analysis but is not a necessary condition, the optically generated electrons generated in the P region will diffuse to the p-n junction and constitute the photocurrent. If the APD 10 is operated at sufficiently high bias so that $W_D^I=W_I$, and if the electrons generated thermally and optically in the P region experience avalanche multiplication with a gain of M, then the gain normalized dark current is given by:

$$J_D^{tot}/M=(G_{GR}^I+G_{GR}^{I-S})W^I/M+G_{DIF}^P*L_e+G_{GR}^P W_D^P+G_{GR}^{P-S}W_D^P \quad (6)$$

Referring to Equation (6), the sources of dark current from the I region, which correspond to the first term of Equation (6), dominate when the reverse bias is below the avalanche gain voltage threshold of the APD, and the gain normalized dark current of the APD attributable to such dominant sources of the dark current is not multiplied by the gain of the APD. Thus, the gain normalized dark current for the APD is reduced as M increases, as along as the reverse bias applied to the APD is below the avalanche gain voltage threshold of the APD. Although minority carriers generated in the I region will experience some gain, this gain is reduced considerably below that experienced by minority carriers generated in the P region that receive the full gain and, therefore, Equation (6) neglects this effect. If the GR current contribution from the P region is negligible, then the gain normalized dark current becomes gain independent at a reverse bias that is higher than the avalanche gain voltage threshold and is dictated by the relative magnitude of the diffusion current component. This gain independent gain normalized dark current condition, which is borne out in the experimental data illustrated in FIG. 5, exists until either the GR current from the P side or tunnel dark current become significant compared to the p-side diffusion current.

In a preferred embodiment, an APD having a gain normalized dark current that is not gain multiplied can be operated at an avalanche gain that reduces the gain normalized dark current to a minimum to achieve optimal signal-to-noise level performance for the APD, where the APD has an excess noise factor that is substantially gain independent, such as present in the exemplary APD 10.

It also has been experimentally found that the selective application of a reverse bias to SWIR PIN HgCdTe APDs, where such APDs have the above-recited gain normalized dark current behavior, in accordance with the present invention, reduces the gain normalized dark current of such APDs.

In a preferred embodiment, when an APD having the gain normalized dark current behavior of the APD 10, and also having a gain dependent excess noise factor, is operated in accordance with the present invention, the optimized responsivity of such APD occurs at a lower gain (lower reverse bias) than if the APD had a gain independent excess noise factor. The lower gain value depends on the behavior of the excess noise factor, and also on the behavior of the gain normalized dark current as a function of gain, in such APD.

It is to be understood that the method of the present invention can be performed in APDs having the above-recited gain normalized dark current behavior, where the APDs have a homojunction or heterojunction semiconductor architecture or a NIP doping construction.

Thus, it was not previously known or expected in the prior art that later generation HgCdTe APDs, which have a gain normalized dark current that is not multiplied by gain of the APD, can be operated at a selected high reverse bias to achieve a high gain and a reduced gain normalized dark current. Earlier generations of HgCdTe and like APDs had been operated only at relatively low gains, because it was known that high dark currents were generated in such APDs at high gains. There was no expectation in the prior art that later generations of HgCdTe APDs, which were found to have a gain independent excess noise factor, can be operated at high gains that do not generate high dark currents. By applying a selected reverse bias to such later generation HgCdTe and like semiconductor material APDs, which preferably have a gain independent excess noise, the gain normalized dark current in such later generation APDs can be reduced and, most preferably, a minimized gain normalized dark current can be achieved to optimize signal-to-noise level performance.

Although preferred embodiments of the present invention have been described and illustrated, it will be apparent to those skilled in the art that various modifications may be made without departing from the principles of the invention.

What is claimed is:

1. A method of operating an avalanche photodiode in an avalanche gain mode for reducing dark current noise, wherein the photodiode has a gain normalized dark current, wherein the photodiode has sources of dark current that are dominant when a reverse bias below an avalanche gain threshold voltage is applied to the photodiode, wherein the gain normalized dark current of the photodiode attributable to the dominant sources of the dark current is not multiplied by gain of the photodiode, the method comprising: applying a selected reverse bias to the photodiode to cause the photodiode to operate in the avalanche gain mode and to have a gain that reduces the gain normalized dark current of the photodiode, wherein the selected reverse bias is beyond a range in which gain and dark current both increase or decrease simultaneously.

2. The method of claim 1, wherein the photodiode includes a photon absorption region coupled to a carrier multiplication region, wherein the dominant sources of the dark current are substantially comprised of at least one of generation-recombination current and diffusion current generated in the carrier multiplication region.

3. The method of claim 1, wherein the photodiode has an excess noise factor that is substantially gain independent.

4. The method of claim 2, wherein the photodiode includes an intrinsic region interposed between and coupled to the absorption region and the carrier multiplication region.

5. The method of claim 4, wherein the absorption and carrier multiplication regions have a homojunction semiconductor architecture.

6. The method of claim 4, wherein the absorption and carrier multiplication regions have a heterojunction semiconductor architecture.

7. The method of claim 2, wherein the absorption region is a p+ region, and the intrinsic region is an n− region.

8. The method of claim 2, wherein the absorption region is a n+ region, and the intrinsic region is an p− region.

9. The method of claim 1, wherein the photodiode is a HgCdTe avalanche photodiode.

10. The method of claim 1, wherein the selected reverse bias corresponds to a minimized gain normalized dark current for the photodiode that achieves an optimized signal-to-noise level for the photodiode.

11. The method of claim 1, wherein the photodiode has an excess noise factor that is gain dependent.

12. The method of claim 1, wherein the step of applying a selected reverse bias comprises:
   a) applying a plurality of increasing levels of reverse bias to the photodiode, where each reverse bias level causes an increase in gain for the photodiode;
   b) observing the gain normalized dark current of the photodiode for at least the last two applied reverse bias levels to determine whether the gain normalized dark current has been reduced; and
   c) increasing the level of reverse bias applied to the photodiode to obtain the selected reversed bias in response to determining that the gain normalized dark current has been reduced.

13. The method of claim 12, further comprising repeating the observing step and the increasing step until the observed gain normalized dark current is no longer being reduced.

14. The method of claim 13, wherein the selected reverse bias applied to the photodiode is greater than 8 volts.

15. The method of claim 1, wherein the selected reverse bias applied to the photodiode is equal to or greater than 8 volts such that photodiode has a gain greater than 100 times an input voltage corresponding to a charge absorbed by the photodiode, while the gain normalized dark current is reduced to less than 100 nA/cm$^2$ or less.

16. The method of claim 1, wherein the selected reverse bias applied to the photodiode is equal to or greater than 10 volts such that photodiode has a gain greater than 100 times an input voltage corresponding to a charge absorbed by the photodiode, while the gain normalized dark current is reduced to 3.4 nA/cm$^2$ or less.

* * * * *